United States Patent
Takahashi

(10) Patent No.: US 6,654,700 B2
(45) Date of Patent: Nov. 25, 2003

(54) TESTING METHOD OF SEMICONDUCTOR INTEGRATED CIRCUIT AND EQUIPMENT THEREOF

(75) Inventor: Kazuya Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,331

(22) Filed: Oct. 24, 2001

(65) Prior Publication Data

US 2002/0052705 A1 May 2, 2002

(30) Foreign Application Priority Data

Oct. 31, 2000 (JP) ........................................ 2000-333259

(51) Int. Cl.[7] ........................ G01R 27/28; G01R 31/00; G01R 31/14
(52) U.S. Cl. ........................................ 702/117; 324/765
(58) Field of Search .............................. 702/66, 75, 79, 702/117–118, 124–126; 324/520–521, 527, 535, 765; 327/39, 40, 42, 50, 58–60

(56) References Cited

U.S. PATENT DOCUMENTS

| | | | |
|---|---|---|---|
| 5,414,457 A | 5/1995 | Kadowaki et al. | 348/14 |
| 5,557,483 A | 9/1996 | Takahashi | 360/74.6 |
| 6,058,496 A | * 5/2000 | Gillis et al. | 714/727 |

* cited by examiner

Primary Examiner—Marc S. Hoff
Assistant Examiner—Mary Catherine Baran
(74) Attorney, Agent, or Firm—Fitzpatrick, Cella, Harper & Scinto

(57) ABSTRACT

A reference clock is inputted into a target IC from a reference clock generator, and an output signal whose frequency is minutely deviated is converted into binary digital output data by a digitizer to be stored in an area A of memory. A computing unit generates digital data having the same period as a reference clock to store the digital data in an area B of the memory. Ternary numeric data is obtained by subtracting data in the area B from data in the area A of the memory to be stored in an area C of the memory. Data in the area C is added to the numeric data every fixed time and is stored in an area D of the memory. An amplitude of a waveform of this data is proportional to the deviation amount of a frequency, and, a period thereof corresponds to one period of deviation amount of a frequency. It is possible to easily implement a test for a deviation amount and a period of a frequency by obtaining the relation between the amplitude and deviation amount beforehand.

6 Claims, 3 Drawing Sheets

FIG. 2D

| TIME | 1 | 2 | 3 | 4 | 5 | 6 | 7 | 8 | 9 | --- |
|---|---|---|---|---|---|---|---|---|---|---|
| DATA (c) | 0 | 0 | 1 | 0 | 0 | 0 | −1 | 0 | 0 | --- |
| RESULT OF ADDITION | 0 | 0 | 1 | 1 | 1 | 1 | 0 | 0 | 0 | --- |

THIS IS CORRESPONDING TO ONE CYCLE OF DEVIATION OF FREQUENCY

THIS IS PROPORTIONAL TO DEVIATION AMOUNT OF FREQUENCY

TESTING METHOD OF SEMICONDUCTOR INTEGRATED CIRCUIT AND EQUIPMENT THEREOF

BACKGROUND OF THE INVENTION

1. Field of the Invention

The present invention relates to a testing method of a semiconductor integrated circuit and testing equipment, and in particular, to a method for testing a deviation amount and a period of a frequency in a semiconductor integrated circuit, the method having the steps of minutely deviating a frequency of a clock signal used as a reference and outputting a signal where peaks of a frequency spectrum are dispersed, and equipment thereof.

2. Related Background Art

FIG. 3 is a block diagram for explaining a method of testing for a deviation amount of a frequency in conventional testing equipment for a semiconductor integrated circuit, which comprises a reference clock generator 11, a target IC 12, and a spectrum analyzer 13. When a reference clock is inputted into the target IC 12 from the reference clock generator 11, the reference clock is outputted from the target IC 12 as a signal having a frequency deviated in a certain spectral bandwidth. A frequency spectrum of this output is analyzed with the spectrum analyzer 13, and the deviation amount of the frequency is tested for.

However, there are the following issues in the conventional testing method of a semiconductor integrated circuit that is described above.
(1) An expensive spectrum analyzer is needed.
(2) Displaying the whole deviation of a frequency takes much time.
(3) When performing spectrum analysis of a pulse waveform, it is hard to obtain a spectrum having a form with clear edges.
(4) When the deviation amount of a frequency is small, a spectrum analyzer with fine frequency resolution is needed.
(5) A period of the deviation of a frequency cannot be tested for in the spectrum analyzer.

SUMMARY OF THE INVENTION

Accordingly, an object of the present invention is to provide a testing method of a semiconductor integrated circuit and equipment thereof which make it possible to test for the deviation amount of a frequency without using expensive equipment such as a spectrum analyzer.

In addition, another object of the present invention is to provide a testing method of a semiconductor integrated circuit and equipment thereof that make it possible to test for a period of the deviation of a frequency.

According to one aspect, the present invention which achieves these objectives relates to a testing method of a semiconductor integrated circuit comprising the steps of inputting a reference clock signal into a semiconductor integrated circuit to be tested, making a signal, obtained by minutely deviating a frequency, outputted, subtracting a signal having the same period as the reference clock signal from the above-described signal outputted, accumulating the result of subtraction every fixed time, and computing the deviation amount of a frequency on the basis of an amplitude of a waveform obtained from the result of accumulation.

According to another aspect, the present invention which achieves these objectives relates to testing equipment of a semiconductor integrated circuit comprising input means for inputting a reference clock signal into a semiconductor integrated circuit to be tested, subtracting means for subtracting a signal having the same period as the reference clock signal from the signal that is outputted from the above-described semiconductor integrated circuit and is obtained by minutely deviating the frequency of the reference clock signal, adding means for accumulating the output of the above-described subtracting means every fixed time, and computing means for computing the deviation amount of a frequency on the basis of the amplitude of a waveform obtained from the result of accumulation every fixed time.

Other objectives and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIGS. 2A, 2B, 2C, 2D and 2E are drawings for explaining a testing method of a semiconductor integrated circuit.

DESCRIPTION OF THE PREFERRED EMBODIMENTS

Hereafter, a suitable embodiment according to the present invention will be described in detail, with reference to the accompanying drawings.

Figure 1:
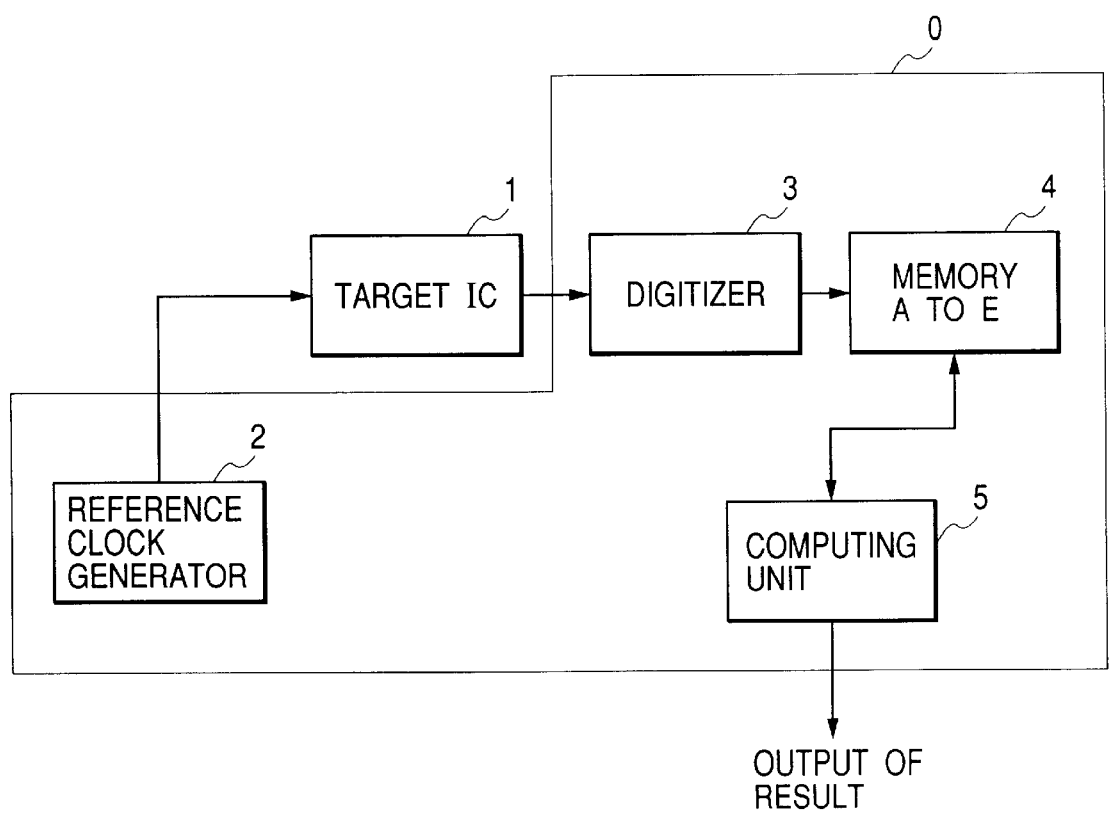
FIG. 1 is a block diagram showing an example of testing equipment of a semiconductor integrated circuit according to the present invention.

FIG. 1 is a block diagram showing an embodiment of testing equipment of a semiconductor integrated circuit (IC). The testing equipment 0 tests a target IC 1. A reference clock generator 2 is connected to the input side of this target IC 1, and, on the other hand, a digitizer 3 is connected to the output side of the target IC 1. A digital output of the digitizer 3 is connected to memory 4, and this memory 4 is connected to a computing unit 5. The memory 4 has storage areas A to E, and the computing unit 5 is constituted so that it can freely write data in these areas A to E.

In such constitution, a test of the target IC 1 is performed according to the following procedure.

Figure 2A:
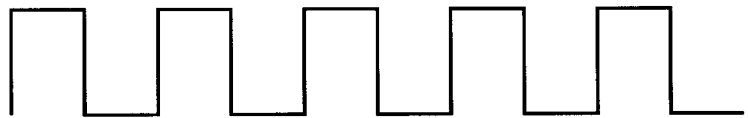

First, a reference clock is inputted into the target IC 1 from the reference clock generator 2, and an arbitrary number of samples are converted from an output signal, whose frequency is minutely deviated, into binary digital output data, shown in FIG. 2A, by the digitizer 3. In this case, a number of clocks to be converted must be a number corresponding to the time that is one frequency deviation period or more. Then, the digital output data converted by the digitizer 3 is stored in the area A of the memory 4.

Figure 2B:
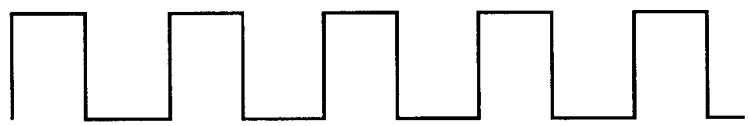

Next, in the computing unit 5, an arbitrary number of digital data having the same period as the reference clock as shown in FIG. 2B are generated, and are stored in the area B of the memory 4. In this case, the number of the data generated must be the same number as that of the output data in FIG. 2A.

Figure 2C:
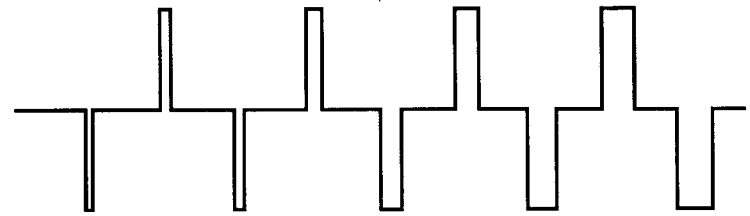

Next, the data in the area B of the memory 4 is subtracted from the data in the area A to obtain ternary numeric data as shown in FIG. 2C, and this numeric data is stored in the area C of the memory 4. The data in the area C of the memory 4 is accumulated every fixed time, and, as shown in FIG. 2D, is stored in the area D of the memory 4.

Figure 2E:
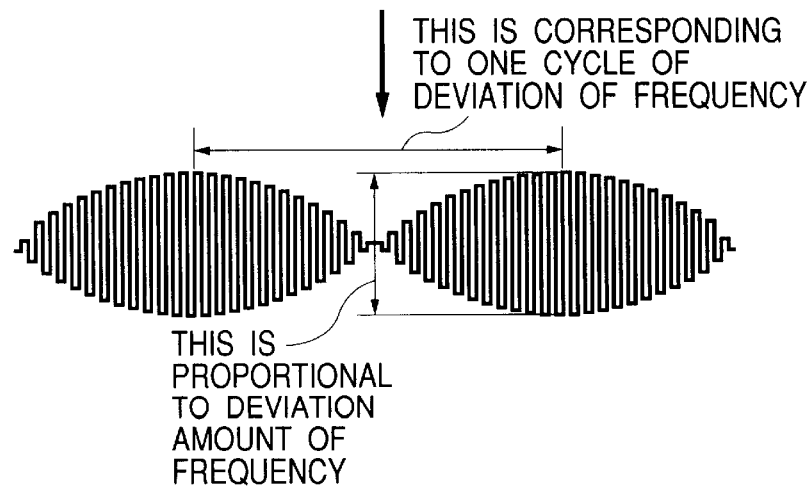
Figure 3:
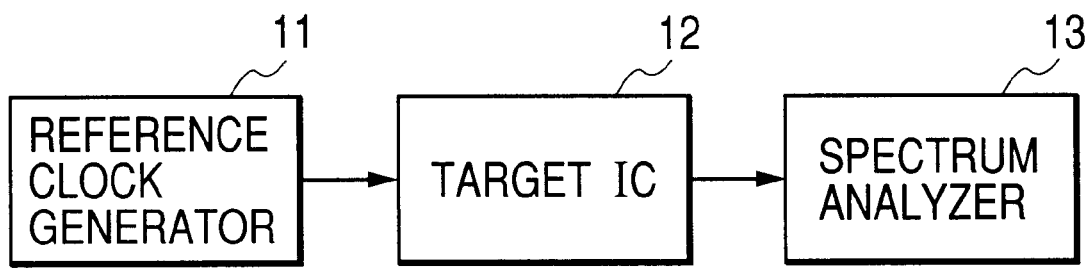
FIG. 3 is a block diagram showing conventional testing equipment of a semiconductor integrated circuit.

A waveform of the numeric data in the area D of the memory 4 is shown in FIG. 2E, the amplitude of this waveform is proportional to the deviation amount of the frequency, and its period is equivalent to one period of the frequency deviation. Hence it becomes possible to easily implement the test for the deviation amount and period of a frequency by obtaining a ratio of the amplitude to the deviation amount beforehand.

Here, a waveform as shown in FIG. 2E may continuously increase or decrease under the influence of the precision of a measuring system, etc. In this case, the test is performed by directly connecting the reference clock generator 2 to the digitizer 3 with removing the target IC 1 beforehand, obtaining waveform data, shown in FIG. 2E, according to the same procedure as the procedure described above, storing the waveform data in the area E of the memory 4, and using waveform data obtained by subtracting the data in the area E of the memory 4 from the data in the area D of the memory 4 obtained by the actual test.

As described above, by subtracting the clock signal, which serves as a reference, from the output signal of a semiconductor integrated circuit, accumulating the result every fixed time, and obtaining the deviation amount and period of a frequency from the amplitude and period of the waveform that are obtained, the test for the deviation amount and period of the frequency becomes implementable even if expensive equipment such as a spectrum analyzer is not used.

In addition, since the test can be achieved with only digitizing waveforms in one period of a frequency, test time can be shortened sharply. In addition, since it becomes unnecessary to pay attention to a form of a frequency spectrum such as with a spectrum analyzer and there is also not an issue of the resolution of a frequency, the test with high precision becomes implementable.

In addition, within a range where functions of the above-described embodiments can be implemented, the present invention can be applied to not only a system which includes a plurality of equipment (for example, a main body of a computer, interface devices, a display, etc.) but also equipment constituted by a single instrument.

Although the present invention has been described in its preferred form with a certain degree of particularity, many apparently widely different embodiments of the invention can be made without departing from the spirit and the scope thereof. It is to be understood that the invention is not limited to the specific embodiments thereof except as defined in the appended claims.

What is claimed is:

1. A testing method for a semiconductor integrated circuit comprising the steps of:

causing a signal, whose frequency is minutely deviated, to be outputted from a semiconductor integrated circuit to be tested by inputting a reference clock signal thereto;

subtracting a signal, having the same period as that of the reference clock signal, from the signal outputted from the semiconductor integrated circuit;

accumulating the result of subtraction every fixed time; and computing a deviation amount of a frequency of the signal outputted from the semiconductor integrated circuit on the basis of an amplitude of a waveform formed by the result of accumulation.

2. The testing method according to claim 1, further comprising the step of obtaining a period of the deviation amount of the frequency on the basis of a period of the waveform.

3. The testing method according to claim 1, wherein the subtracting step comprises the sub-steps of converting the output signal from the semiconductor integrated circuit into first digital data, generating second digital data having the same period as that of the reference clock, and subtracting the second digital data from the first digital data.

4. The testing method according to claim 3, wherein the subtracting step comprises the sub-steps of storing the first digital data in a first storage area, storing the second digital data in a second storage area, and storing third digital data, obtained by subtracting the second digital data in the second storage area from the first digital data in the first storage area, in a third storage area, and wherein the accumulating step comprises the sub-steps of adding the third digital data in the third storage area to an accumulated value in a fourth storage area every fixed time, and additionally storing the new accumulated value in the fourth storage area.

5. The testing method according to claim 1, further comprising the steps of generating a second waveform according to the same procedure as that for the waveform with using a second reference clock signal instead of the output of the semiconductor integrated circuit, generating a third waveform by subtracting the second waveform from the waveform, and computing a deviation amount of a frequency of the second reference clock signal on the basis of an amplitude of the third waveform.

6. Testing equipment for a semiconductor integrated circuit comprising:

input means for inputting a reference clock signal into a semiconductor integrated circuit to be tested;

subtracting means for subtracting a signal, having the same period as the reference clock signal, from a signal whose frequency is minutely deviated from a frequency of the reference clock signal and which is outputted from the semiconductor integrated circuit;

adding means for accumulating an output of said subtracting means every fixed time; and computing means for computing a deviation amount of a frequency of the signal outputted from the semiconductor integrated circuit on the basis of an amplitude of a waveform formed by the result of addition every fixed time by said adding means.

* * * * *

UNITED STATES PATENT AND TRADEMARK OFFICE
CERTIFICATE OF CORRECTION

PATENT NO. : 6,654,700 B2
DATED : November 25, 2003
INVENTOR(S) : Kazuya Takahashi It is certified that error appears in the above-identified patent and that said Letters Patent is hereby corrected as shown below:

Title page,
Item [56], References Cited, U.S. PATENT DOCUMENTS, please insert the following references:

| | | | |
|---|---|---|---|
| -- 6,134,191 | 10/2000 | Alfke | 368/118 |
| 5,471,396 | 11/1995 | White | 702/66 |
| 6,154,715 | 11/2000 | Dinteman et al. | 702/120 |
| 5,832,424 | 11/1998 | Tsutsui | 704/200.1 |
| 5,487,016 | 01/1996 | Elms | 702/71 |
| 5,432,716 | 07/1995 | Lebowsky et al. | 702/190 |
| 5,339,182 | 08/1994 | Kimble et al. | 359/112 |
| 5,694,483 | 12/1997 | Onoguchi | 382/154 |
| 6,002,991 | 12/1999 | Robert O. Conn, Jr. | 702/117 |
| 5,677,915 | 10/1997 | Whetsel | 714/726 --. |

Signed and Sealed this

Second Day of November, 2004

JON W. DUDAS
*Director of the United States Patent and Trademark Office*